(12) United States Patent (10) Patent No.: US 11,088,609 B2
Goeke (45) Date of Patent: Aug. 10, 2021

(54) LOW NOISE POWER SUPPLY MOSFET GATE DRIVE SCHEME

(71) Applicant: Keithley Instruments, LLC, Solon, OH (US)

(72) Inventor: Wayne C. Goeke, Hudson, OH (US)

(73) Assignee: Keithley Instruments, LLC, Solon, OH (US)

( * ) Notice: Subject to any disclaimer, the term of this patent is extended or adjusted under 35 U.S.C. 154(b) by 0 days.

(21) Appl. No.: 14/542,231

(22) Filed: Nov. 14, 2014

(65) Prior Publication Data

US 2016/0141948 A1    May 19, 2016

(51) Int. Cl.
*H02M 1/00* (2006.01)
*H03K 17/16* (2006.01)
*H02M 3/335* (2006.01)

(52) U.S. Cl.
CPC ......... *H02M 1/00* (2013.01); *H02M 3/33569* (2013.01); *H03K 17/163* (2013.01); *H03K 17/166* (2013.01); *H02M 2001/0029* (2013.01); *H03K 2217/0036* (2013.01)

(58) Field of Classification Search
CPC .. H02M 3/156; H02M 3/158; H02M 3/33569; H02M 2001/0058; H03K 17/04123; H03K 17/08122; H03K 17/302
See application file for complete search history.

(56) References Cited

U.S. PATENT DOCUMENTS

| 6,051,995 | A | 4/2000 | Pollachek |
| 6,693,804 | B2* | 2/2004 | Suzuki .................... H02M 1/12 363/134 |
| 6,967,374 | B1 | 11/2005 | Saito et al. |
| 7,145,786 | B2 | 12/2006 | Vinciarelli |
| 7,365,584 | B2* | 4/2008 | Bennett .............. H03K 17/0822 327/110 |
| 7,667,524 | B2 | 2/2010 | Thierry et al. |
| 7,847,604 | B2 | 12/2010 | Fuma et al. |
| 7,994,827 | B2 | 8/2011 | Williams |
| 8,134,851 | B2 | 3/2012 | Soldano et al. |
| 8,305,053 | B2* | 11/2012 | Truong ................. H02M 3/158 323/224 |
| 2009/0027096 | A1 | 1/2009 | Mourrier et al. |
| 2009/0066402 | A1 | 3/2009 | Hiyama |
| 2013/0207712 | A1 | 8/2013 | Suzuki et al. |

FOREIGN PATENT DOCUMENTS

| JP | 2003188699 | 7/2003 |
| WO | 2006052667 A2 | 5/2006 |
| WO | 2006116710 A2 | 11/2006 |

OTHER PUBLICATIONS

Yee, H.P., "An EMI Suppression MOSFET Driver," APEC '97 Twelfth Annual Applied Power Electronics Conference and Exposition, Atlanta. IEEE, vol. CONF. 12, Feb. 23, 1997, pp. 242-248.
European Search Report for Application No. 15194579.7 dated Apr. 8, 2016, 10 pages.

* cited by examiner

*Primary Examiner* — Lincoln D Donovan
*Assistant Examiner* — Colleen J O Toole
(74) *Attorney, Agent, or Firm* — Miller Nash Graham & Dunn; Andrew J. Harrington (57) ABSTRACT

A switching power supply can include multiple power MOSFETs that receive an initial gate drive waveform comprising a fast slew rate region having a negative slope and a slow slew rate region also having a negative slope. The MOSFETs can turn off during the slow slew rate region of the initial gate drive waveform.

28 Claims, 8 Drawing Sheets

LOW NOISE POWER SUPPLY MOSFET GATE DRIVE SCHEME

TECHNICAL FIELD

This disclosure relates generally to power supplies and, more particularly, to low noise switching power supplies.

BACKGROUND

Figure 1:
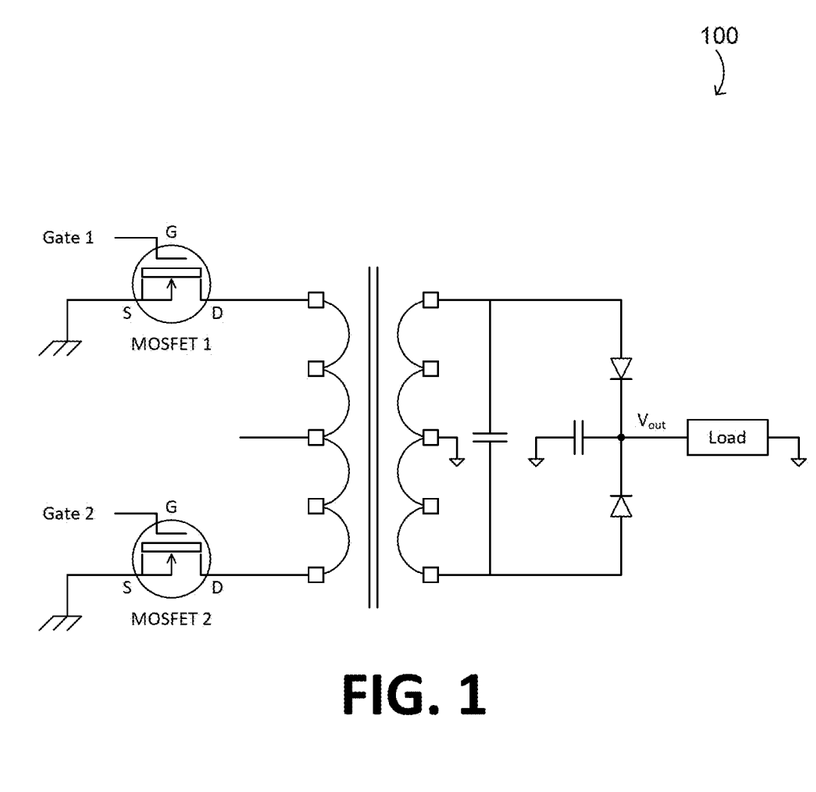
FIG. 1 illustrates an example of a push-pull DC-to-DC power supply using zero voltage switching (ZVS).

Low noise power supplies generally require both the voltage and the current to be switched softly. Techniques such as zero voltage switching (ZVS) typically allow the voltage transitions to have controlled slew rates. FIG. 1 illustrates an example of a push-pull DC-to-DC power supply 100 using ZVS. In the example, the power supply 100 includes two first metal-oxide-semiconductor field-effect transistor (MOSFETs) (here, MOSFET 1 and MOSFET 2) and an output voltage ($V_{out}$) at a load (Load).

Softly switching the current off usually requires applying a series impedance that is large enough to force the current to ramp down but not so large that the current's slew rate results in an unacceptable level of noise. One generally accepted means for applying such a series impedance is to slowly drive the gate of a MOSFET through its threshold voltage.

Most, if not all, power MOSFETs have threshold voltages that vary several volts from part to part and can vary with temperature as well. A slow gate drive transition will generally result in a large variation in the time at which the threshold is crossed. A gate drive that can swing though all possible threshold volts in a reasonable amount time will result in the MOSFET switching the current faster and generating more noise, however.

Figure 2:
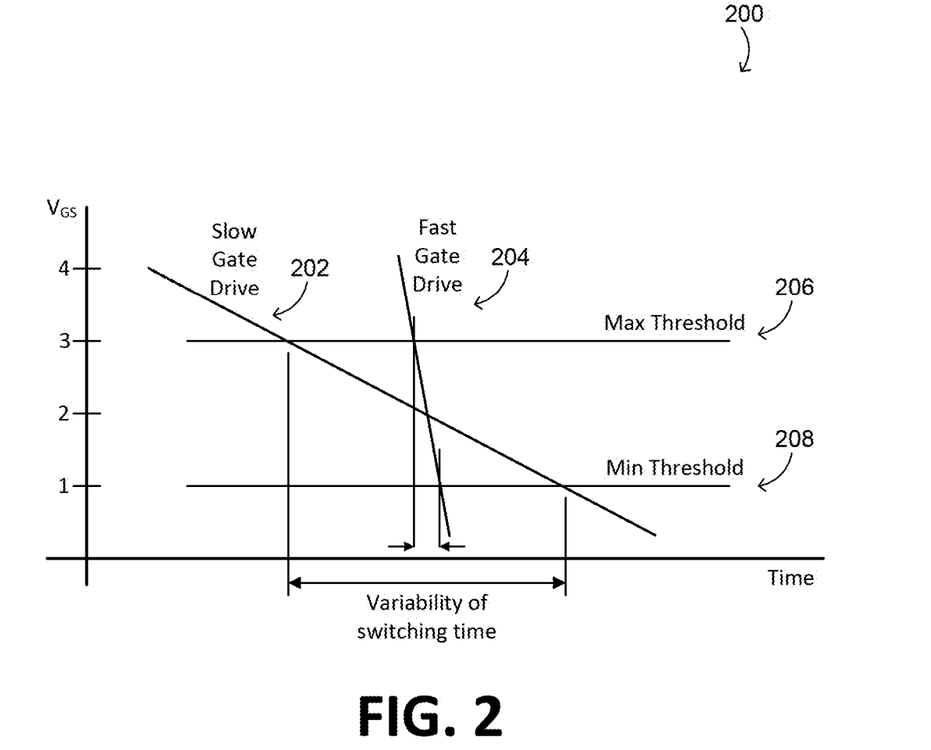
FIG. 2 is a graphical representation of an example of a gate drive waveform illustrating the impact that slow and fast gate drives can have on the variation in the timing of the switching for a typical switching power supply.

FIG. 2 is a graphical representation of a gate drive waveform 200 illustrating the impact that a slow gate drive 202 and a fast gate drive 204 can have on the variation in time for the switching of a typical switching power supply. One can readily ascertain that a fast gate drive 204 results in a smaller variation in timing (e.g., between the maximum threshold 206 and the minimum threshold 208) than the slow gate drive 202.

Accordingly, there remains a need for improved low noise switching power supplies.

SUMMARY

Embodiments of the disclosed technology are generally directed to a switching power supply where the primary power MOSFETs are driven on and/or off using a gate drive waveform that has both a fast slew rate region and a slow slew rate region for positive and/or negative slopes. After an initial turn-on of the power supply, the offset or shape of the gate drive waveforms may be adjusted independently for each MOSFET such that the threshold of each MOSFET is traversed by the slow slew rate region of its gate drive waveform at a controlled point in time.

DETAILED DESCRIPTION

Embodiments of the disclosed technology may include at least one metal-oxide-semiconductor field-effect transistor (MOSFET), at least one waveform generator configured to drive a gate of each of the at least one MOSFET such that the off transition of each of the at least one MOSFET is shaped to have a faster slewing region followed by a slower slewing region, and a detection component configured to detect a time that each of the at least one MOSFET switches off.

The at least one MOSFET may include an n-channel MOSFET in which the gate drive slews negative to turn the MOSFET(s) off. In alternative embodiments, the at least one MOSFET may include a p-channel MOSFET in which the gate drive would slew positive to turn the MOSFET(s) off.

Figure 3:
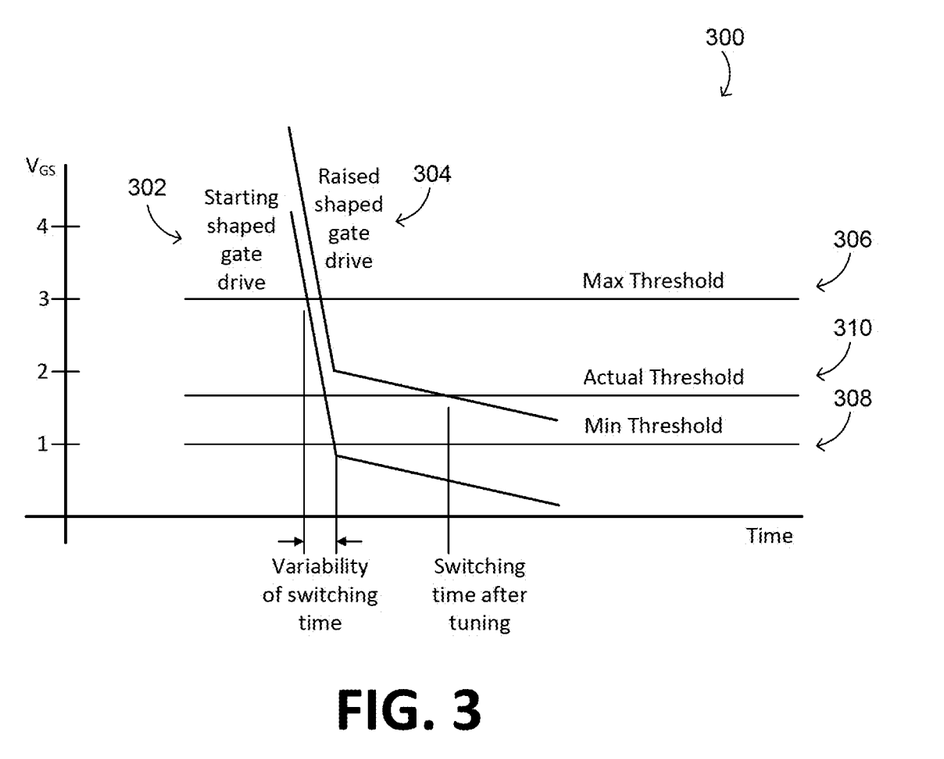
FIG. 3 is a graphical representation of an example of gate drive waveforms illustrating the impact that initial and raised gate drives can have on switching times for certain implementations of the disclosed technology.

Unlike a signal fast gate drive of today's power supplies, implementations of the disclosed technology generally include a gate drive that is shaped to have a fast edge followed by a slow edge, e.g., such that the fast edge can cut through all possible thresholds in a relatively short amount of time. FIG. 3 is a graphical representation of an example of gate drive waveforms 300 illustrating the impact that an initial gate drive 302 and a raised gate drive 304 can have on switching times for certain implementations of the disclosed technology. In the example, the starting shaped gate drive or initial gate drive 302 has a fast edge that crosses both the maximum threshold 306 and the minimum threshold 308 but is not followed by a slow edge until after it has completely crossed all possible threshold between the maximum threshold 306 and the minimum threshold 308.

Once the power supply is running, a measurement of when the MOSFET turns off with respect to the gate drive waveform can be made. Raising the gate drive waveform will cause the MOSFET to turn off later. Thus, the gate drive waveform can be raised 304 until the MOSFET turns off during the slow edge of the raised waveform 304, as indicated by its crossing the actual threshold 310. In this situation, the MOSFET is now turning the current off at a slower rate and, consequently, the noise generated will be advantageously reduced.

Figure 4:
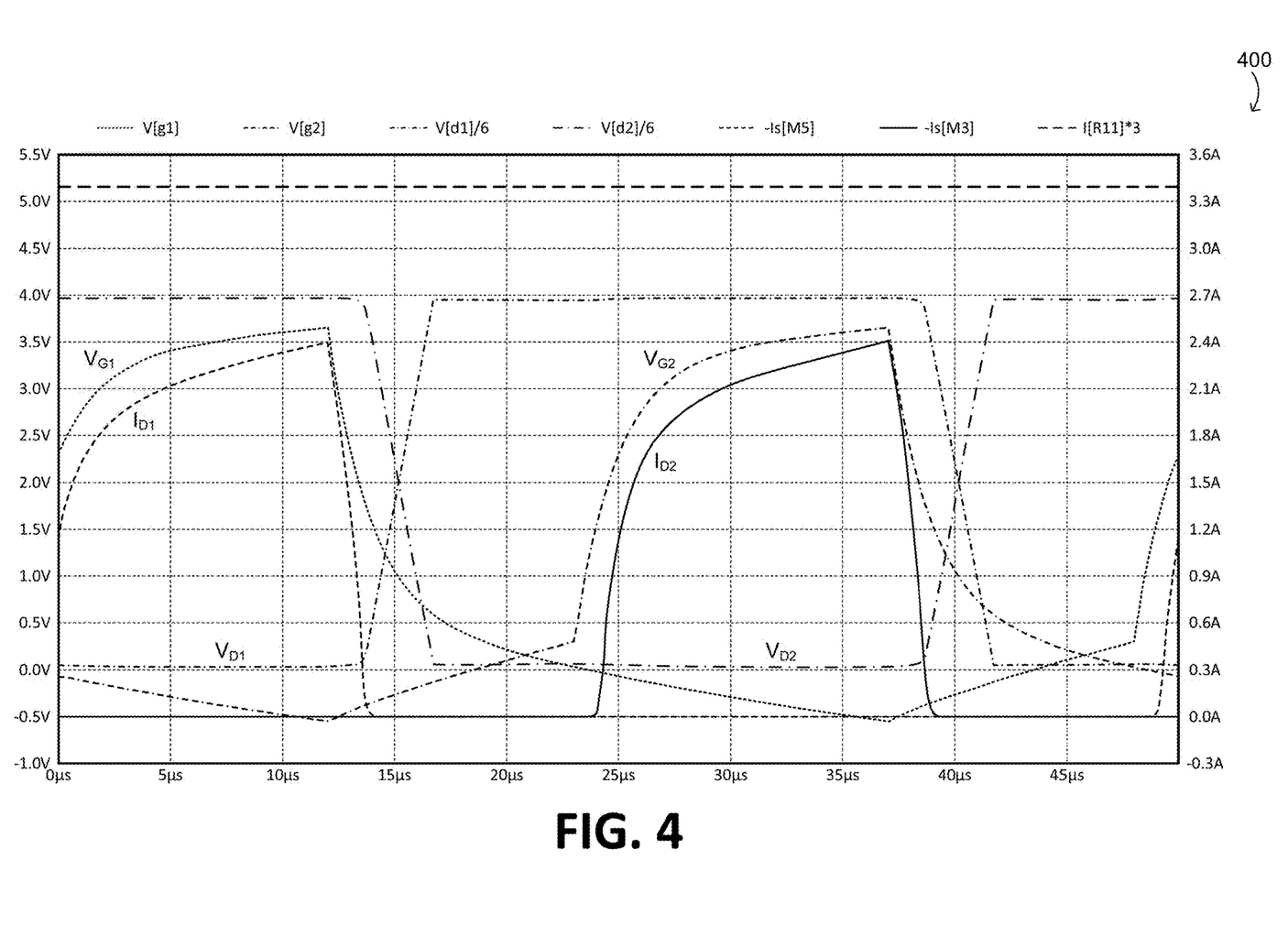
FIG. 4 is a graphical representation of an example of initial gate drive voltages for certain implementations of the disclosed technology.

FIG. 4 is a graphical representation of an example of initial gate drive voltages 400 for certain implementations of the disclosed technology. In the example, the initial gate drive voltages ($V_{G1}$ and $V_{G2}$) quickly pass through all possible thresholds (e.g., 1 to 3 volts). The drain currents ($I_{D1}$ (here, ~13 uS) and $I_{D2}$ (here, ~38 uS) turn off quickly. Once the drain current is off (i.e., the MOSFET is off), the drain voltages ($V_{D1}$ and $V_{D2}$, respectively) of MOSFET 1 and MOSFET 2 flip voltages at ~15 uS and at ~40 uS, respectively. This allows the drain that is near zero volts to be turned on with approximately zero volts across it (i.e., ZVS). Here, MOSFET 2 is turned on at ~24 uS and MOSFET 1 is turned on at ~49 uS.

Figure 5:
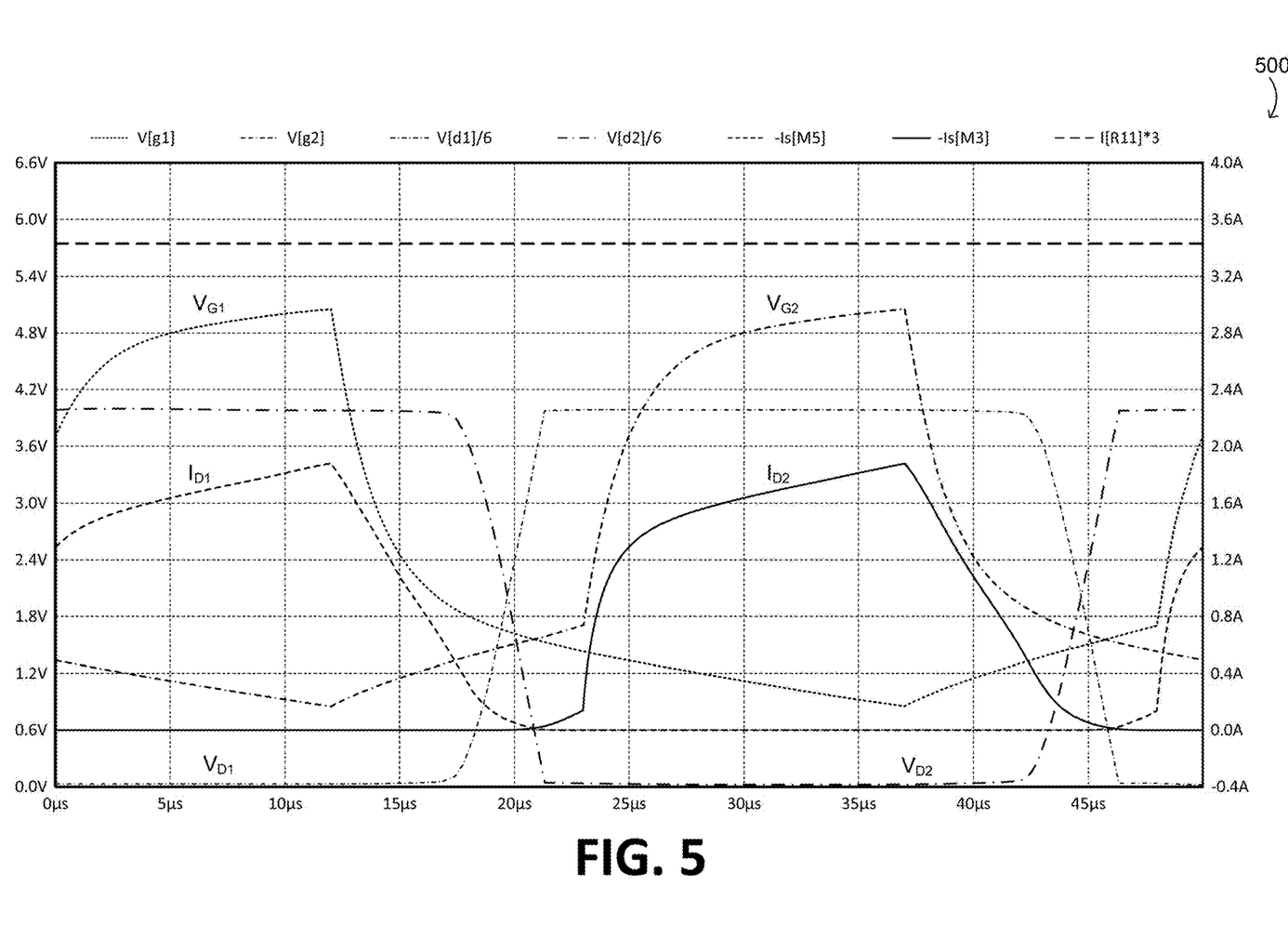
FIG. 5 is a graphical representation of an example of raised gate drive voltages for certain implementations of the disclosed technology.

FIG. 5 is a graphical representation of an example of raised gate drive voltages 500 for certain implementations of the disclosed technology. After a tuning (e.g., by raising the gate drive waveforms), the gate drives voltages ($V_{G1}$ and $V_{G2}$) pass through the MOSFET thresholds (here, ~2V) slowly and the drain currents ($I_{D1}$ and $I_{D2}$) turn off slower.

Figure 6:
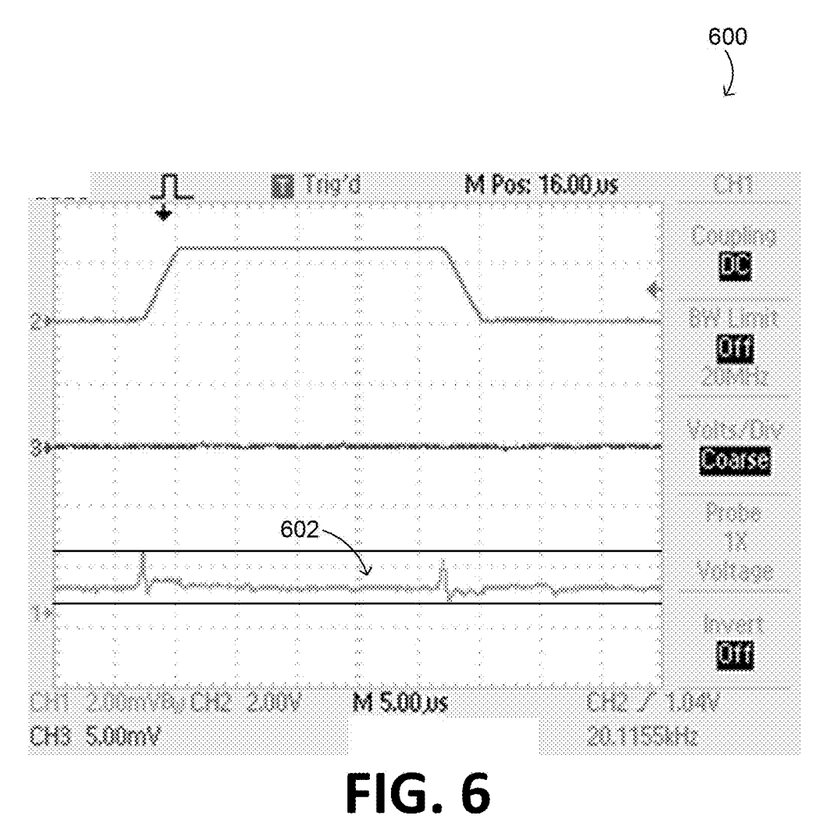
FIG. 6 is a graphical representation of an example of common mode noise measured on an oscilloscope through a resistor before tuning in accordance with certain embodiments of the disclosed technology.

FIG. 6 is a graphical representation of an example of common mode noise measured on an oscilloscope through a resistor 600 before the gate drives have been tuned in accordance with certain embodiments of the disclosed technology. In the example, the resistor is a 2 kilo-Ohm resistor connected between the primary ground and the secondary ground of the power supply (here, 2 mV=>1 uA). In the figure, Scope CH2 is measuring one of the drain voltages. Before the gate drives have been tuned, the probe voltage (CH1) 602 has a measured range of ~0.8*2 mV, which translates to 0.8 uA peak-to-peak.

Figure 7:
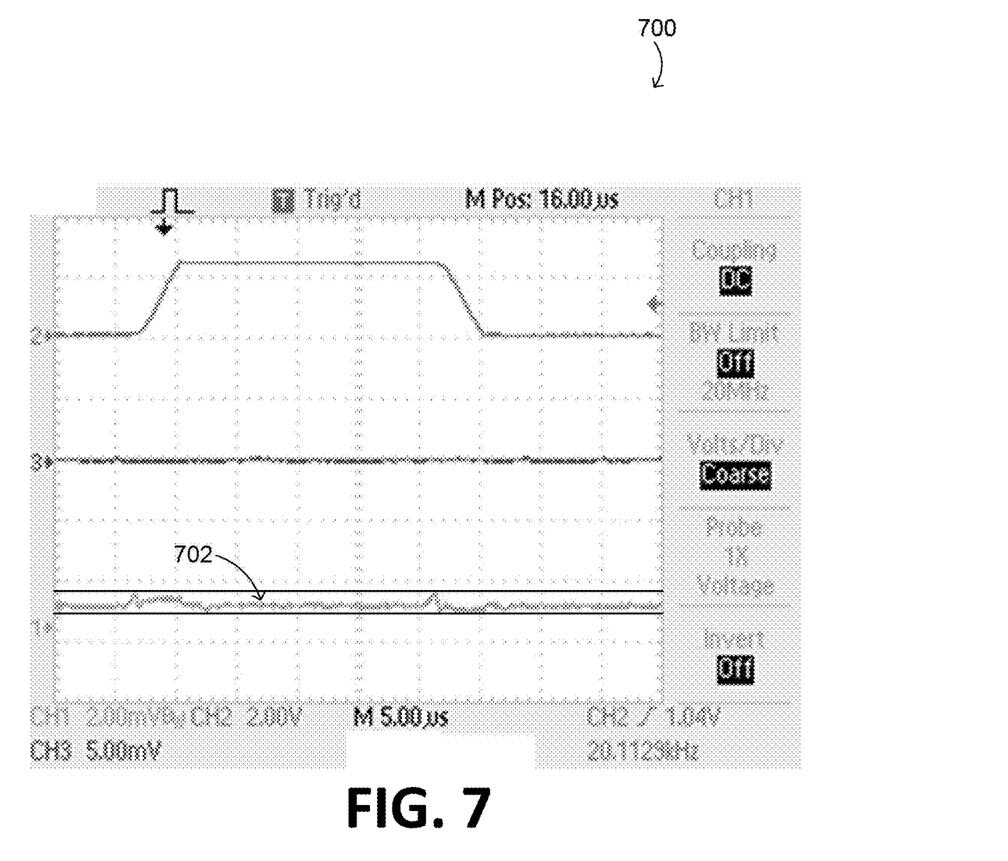
FIG. 7 is a graphical representation of an example of common mode noise measured on an oscilloscope through a resistor after tuning in accordance with certain embodiments of the disclosed technology.

FIG. 7 is a graphical representation of an example of common mode noise measured on an oscilloscope through a resistor 700 after tuning (e.g., after the measurement taken in FIG. 6) in accordance with certain embodiments of the disclosed technology. In the example, after tuning has been completed, the probe voltage (CH1) 702 now has a measured range of ~0.2*2 mV, which translates to 0.2 uA peak-to-peak—this represents an [approximate] fourfold improvement over the measurement taken in FIG. 6.

Figure 8:
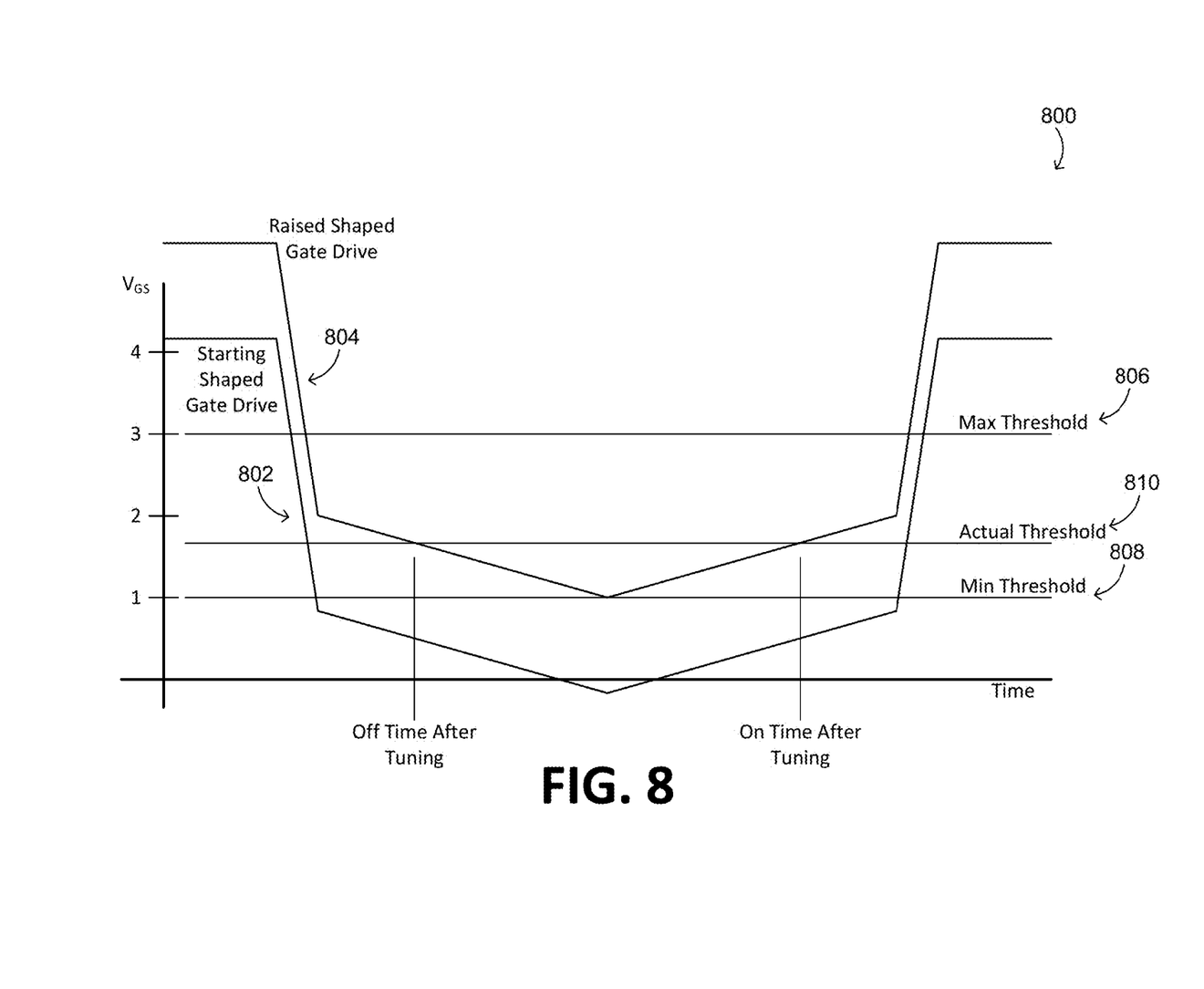
FIG. 8 illustrates an example in which a MOSFET is turned off and subsequently turned back on in accordance with certain embodiments of the disclosed technology.

FIG. 8 illustrates an example in which a MOSFET is turned off and subsequently turned back on 800 in accordance with certain embodiments of the disclosed technology. In the example, the starting shaped gate drive or initial gate drive 802 has a fast edge that crosses both the maximum possible threshold 806 and the minimum possible threshold 808 but is not followed by a slow edge until after it has completely crossed the minimum possible threshold 808. The gate drive waveform can be raised 804 until the MOSFET turns off during the slow edge of the raised waveform 804, as indicated by its crossing the actual threshold 810.

Here, the initial gate drive 802 and raised waveform 804 both have upward slow and fast edges that roughly correspond to the initial, downward slow and fast edges, respectively, such that the MOSFET turns back on during the latter slow edge of the raised waveform 804, as indicated by its crossing the actual threshold 810 a second time.

The following discussion is intended to provide a brief, general description of a suitable machine in which embodiments of the disclosed technology can be implemented. As used herein, the term "machine" is intended to broadly encompass a single machine or a system of communicatively coupled machines or devices operating together. Exemplary machines may include computing devices such as personal computers, workstations, servers, portable computers, handheld devices, tablet devices, and the like.

Typically, a machine includes a system bus to which processors, memory such as random access memory (RAM), read-only memory (ROM), and other state-preserving medium, storage devices, a video interface, and input/output interface ports can be attached. The machine may also include embedded controllers such as programmable or non-programmable logic devices or arrays, Application Specific Integrated Circuits (ASICs), embedded computers, smart cards, and the like. The machine may be controlled, at least in part, by input from conventional input devices such as keyboards and mice, as well as by directives received from another machine, interaction with a virtual reality (VR) environment, biometric feedback, or other pertinent input.

The machine may utilize one or more connections to one or more remote machines, such as through a network interface, modem, or other communicative coupling. Machines can be interconnected by way of a physical and/or logical network, such as an intranet, the Internet, local area networks, wide area networks, etc. One having ordinary skill in the art will appreciate that network communication may utilize various wired and/or wireless short range or long range carriers and protocols, including radio frequency (RF), satellite, microwave, Institute of Electrical and Electronics Engineers (IEEE) 545.11, Bluetooth, optical, infrared, cable, laser, etc.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments that are described herein, this detailed description and accompanying material is intended to be illustrative only, and should not be taken as limiting the scope of the invention. What is claimed as the invention, therefore, is all such modifications as may come within the scope and spirit of the following claims and equivalents thereto.

What is claimed is:

1. A method of controlling a metal-oxide-semiconductor field-effect transistor (MOSFET) in a switching power supply, the method comprising:
    in a single on-to-off transition of the transistor, applying a voltage waveform to a gate of the transistor, the voltage waveform having a steeper slope in a first stage of the voltage waveform and a more shallow slope in a second stage of the voltage waveform;
    determining that the transistor has turned off at the conclusion of the single on-to-off transition;
    determining which of the first stage or the second stage of the voltage waveform was being applied to the gate of the transistor when the transistor turned off; and
    adjusting a starting voltage value of the voltage waveform to be applied to the gate of the transistor in a subsequent on-to-off transition to cause the transistor to turn off at the conclusion of the subsequent on-to-off transition while the second stage of the voltage waveform is being applied to the gate of the transistor.

2. The method of claim 1, in which the voltage waveform applied to the gate of the transistor has an unchanging shape for each on-to-off transition of the transistor.

3. The method of claim 1, in which, as compared between the first stage of the voltage waveform and the second stage of the voltage waveform, the transistor turns off more quickly while the first stage of the voltage waveform is applied to the gate of the transistor; and in which the transistor turns off more slowly while the second stage of the voltage waveform is applied to the gate of the transistor.

4. The method of claim 1, in which, as compared between the first stage of the voltage waveform and the second stage of the voltage waveform, the transistor power supply generates more common mode electrical noise when the transistor turns off while the first stage of the voltage waveform is being applied to the gate of the transistor.

5. The method of claim 1, in which the transistor is an NMOS transistor, and in which the voltage waveform applied to the gate of the transistor is decreasing in voltage value in the first stage and the second stage.

6. The method of claim 1, in which the transistor is an NMOS transistor, and in which the starting voltage value of the voltage waveform is a positive voltage.

7. The method of claim 1, in which the transistor is an NMOS transistor, and in which the starting voltage value of the voltage waveform is above the actual threshold voltage of the transistor.

8. The method of claim 1, in which the transistor is an NMOS transistor, and in which adjusting the starting voltage value comprises increasing the starting voltage value.

9. The method of claim 8, in which the starting voltage value is increased from approximately 2.3 volts to 3.7 volts.

10. The method of claim 1, in which the transistor is an NMOS transistor, and in which increasing the starting voltage value causes the transistor to be turned off at a point nearer to an end of the second stage of the voltage waveform than nearer to a beginning of the first stage of the voltage waveform.

11. The method of claim 1, in which the transistor is a PMOS transistor, and in which the voltage waveform applied to the gate of the transistor is increasing in voltage value in the first stage and the second stage.

12. The method of claim 1, in which the transistor is a PMOS transistor, and in which the starting voltage value of the voltage waveform is a negative voltage.

13. The method of claim 1, in which the transistor is a PMOS transistor, and in which the starting voltage value of the voltage waveform is below the actual threshold voltage of the transistor.

14. The method of claim 1, in which the transistor is a PMOS transistor, and in which adjusting the starting voltage value of the voltage waveform comprises decreasing the starting voltage value.

15. The method of claim 1, in which the transistor is a PMOS transistor, and in which decreasing the starting voltage value causes the transistor to be turned off at a point nearer to an end of the second stage of the voltage waveform than nearer to a beginning of the first stage of the voltage waveform.

16. The method of claim 1, in which the voltage waveform applied to the gate of the transistor comprises, in a single off-to-on transition of the transistor:
  a third stage having an equal but opposite slope compared to the second stage of the gate driving waveform; and
  a fourth stage having an equal but opposite slope compared to the first stage of the gate driving waveform.

17. The method of claim 1, in which determining that the transistor has turned off comprises inspecting a voltage at a drain of the transistor.

18. The method of claim 1, in which determining that the transistor has turned off comprises comparing a voltage at a drain of the transistor to a voltage where it is known that the transistor is on.

19. A driving circuit for a gate of a metal-oxide-semiconductor field-effect transistor (MOSFET) in a switching power supply, the driving circuit comprising:
  a defined voltage waveform for applying to a gate of the transistor in a single on-to-off transition of the transistor, the voltage waveform having a steeper slope in a first stage of the voltage waveform and a more shallow slope in a second stage of the voltage waveform;
  a detection component structured to determine when the transistor has turned off at the end of the on-to-off transition;
  a stage comparator structured to determine which of the first stage or the second stage of the voltage waveform was being applied to the gate of the transistor when the transistor turned off; and
  a tuning circuit structured to adjust a starting voltage value of the voltage waveform to be applied to the gate of the transistor in a subsequent on-to-off transition to cause the transistor to turn off while the second stage of the voltage waveform is being applied to the gate of the transistor during the subsequent on-to-off transition.

20. The driving circuit of claim 19, in which the defined voltage waveform applied to the gate of the transistor has an unchanging shape for each on-to-off transition of the transistor.

21. The driving circuit of claim 19, in which the transistor is an NMOS transistor, and in which the voltage waveform applied to the gate of the transistor is decreasing in voltage value in the first stage and the second stage.

22. The method of claim 21, in which the transistor is an NMOS transistor, and in which the starting voltage value of the voltage waveform is a positive voltage.

23. The driving circuit of claim 19, in which the transistor is an NMOS transistor, and in which the tuning circuit is structured to adjust the starting voltage value by increasing the starting voltage value.

24. The driving circuit of claim 19, in which the defined voltage waveform for applying to the gate of the transistor comprises:
  a third stage having an equal but opposite slope compared to the second stage of the gate driving waveform; and
  a fourth stage having an equal but opposite slope compared to the first stage of the gate driving waveform.

25. The driving circuit of claim 19, in which the detection component comprises a voltage comparator structured to compare a voltage at a drain of the transistor to a voltage where it is known that the transistor is on.

26. A push-pull switching power supply, comprising:
  a first transistor coupled to a first side of a primary winding of a transformer coil;
  a second transistor coupled to a second side of the primary winding of the transformer coil;
  a driving circuit for the first transistor, the driving circuit including:
    a defined voltage waveform for applying to a gate of the first transistor in a single on-to-off transition of the transistor, the voltage waveform having a steeper slope in a first stage of the voltage waveform and a more shallow slope in a second stage of the voltage waveform;
    a detection component structured to determine when the first transistor has turned off at the conclusion of the single on-to-off transition;

a stage comparator structured to determine which of the first stage or the second stage of the voltage waveform was being applied to the gate of the first transistor when the first transistor turned off; and a tuning circuit structured to adjust a starting voltage value of the voltage waveform to be applied to the gate of the first transistor in a subsequent on-to-off transition to cause the first transistor to turn off while the second stage of the voltage waveform is being applied to the gate of the first transistor.

27. The push-pull switching power supply of claim 26, in which the defined voltage waveform applied to the gate of the first transistor has an unchanging shape for each on-to-off transition of the transistor.

28. The push-pull switching power supply of claim 26, further comprising a second driving second for the second transistor.

* * * * *